(12) United States Patent
Diamant et al.

(10) Patent No.: US 9,774,317 B1
(45) Date of Patent: Sep. 26, 2017

(54) BISTABLE-ELEMENT FOR RANDOM NUMBER GENERATION

(71) Applicant: AMAZON TECHNOLOGIES, INC., Seattle, WA (US)

(72) Inventors: Ron Diamant, Albany, CA (US); Dan Trock, Katzrin (IL); Elad Valfer, Kibuz Eyal (IL); Yair Armoza, Beit Dagan (IL)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/250,574

(22) Filed: Aug. 29, 2016

(51) Int. Cl.
| H03K 3/03 | (2006.01) |
| G06F 7/58 | (2006.01) |
| H03K 3/84 | (2006.01) |
| H03K 19/00 | (2006.01) |
| G06F 13/40 | (2006.01) |

(52) U.S. Cl.
CPC ............... H03K 3/84 (2013.01); G06F 7/588 (2013.01); G06F 13/4045 (2013.01); H03K 3/03 (2013.01); H03K 3/0315 (2013.01); H03K 19/0002 (2013.01)

(58) Field of Classification Search
CPC ........ G06F 7/588; G06F 7/58; G06F 13/4045; G06F 21/79; H03K 19/1776; H03K 3/84; H03K 3/037; H03K 19/0826; H03K 19/09429; H03K 19/17768; H03K 3/0375; H03K 27/11898
See application file for complete search history.

(56) References Cited

U.S. PATENT DOCUMENTS

| 5,754,647 | A  | * | 5/1998  | Hsu ........................ G06F 21/79 |
|           |    |   |         | 705/51 |
| 6,771,104 | B2 | * | 8/2004  | Hars ........................ H03K 3/84 |
|           |    |   |         | 327/164 |
| 7,126,860 | B2 | * | 10/2006 | Pratlong .................. G11C 7/12 |
|           |    |   |         | 365/189.05 |
| 7,135,888 | B1 | * | 11/2006 | Hutton ................ H01L 27/0207 |
|           |    |   |         | 257/E27.11 |
| 7,193,437 | B2 | * | 3/2007  | Cappelli .......... H01L 27/11803 |
|           |    |   |         | 257/E27.107 |
| 8,346,832 | B2 |   | 1/2013  | Mudge et al. |
| 8,749,265 | B2 | * | 6/2014  | Kim ........................ G06F 7/588 |
|           |    |   |         | 326/8 |
| 9,105,432 | B2 | * | 8/2015  | Kim ................... H01H 85/0241 |

* cited by examiner

*Primary Examiner* — Vibol Tan
(74) *Attorney, Agent, or Firm* — Blank Rome LLP

(57) ABSTRACT

A bistable cell includes a pair of inverters and multiple pairs of cross-coupled tristate buffers. Each pair of tristate buffers can be individually selected to implement an entropy harvesting state for the bistable cell. Each of the tristate buffers generally has lower strength than the inverters but the inverter-to-buffer strength ratio can be configured through selective use of one or more of the tristate buffer pairs. The resulting entropy harvesting state behavior can be varied based on the inverter-to-buffer strength ratio in terms of greater randomness of the output bits or decreased power consumption.

20 Claims, 6 Drawing Sheets

BISTABLE-ELEMENT FOR RANDOM NUMBER GENERATION

BACKGROUND

The security of many systems, such as cryptographic systems, relies on unpredictability and irreproducibility of digital key-streams that are used for encryption and/or signing of confidential information. There are at least two fundamentally different strategies for generating random bits. One strategy is to compute numbers deterministically using, for example, a software-implemented algorithm that requires an initial input seed value. This class of random number generators is known as Pseudo/Deterministic Random Number Generators (PRNG/DRNG). PRNGs must be provided with a random initialization value (seed) to produce an output value that resembles a random bit-stream. PRNGs are periodic, although the periods are typically very long.

Another strategy is to produce bits non-deterministically, where every bit of output is based on a physical process that is unpredictable. Such physical processes may be based, for example, on the production of thermal (resistance or shot) noise. This class of Random Number Generators (RNGs) is commonly known as True Random Number Generators (TRNGs).

BRIEF DESCRIPTION OF THE DRAWINGS

For a detailed description of various examples, reference will now be made to the accompanying drawings in which.

DETAILED DESCRIPTION

Figure 1:
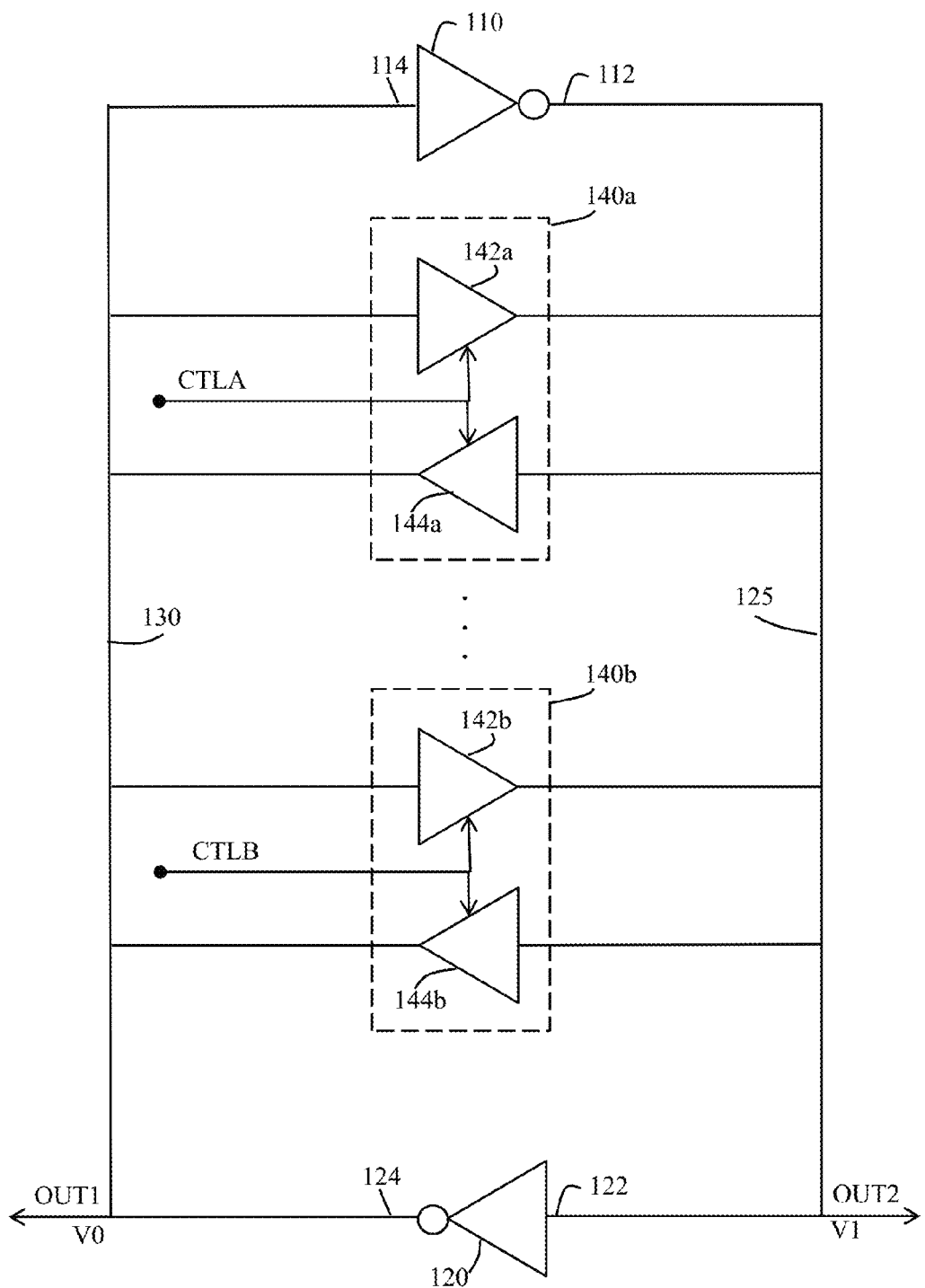
FIG. 1 shows a block diagram of a configurable bistable cell including inverters and multiple pairs of tristate buffers in accordance with various examples.

As noted above, one type of random number generator is the true random number generator (TRNG). One class of TRNG circuits is a ring oscillator. A ring oscillator includes an odd number of inverters connected in series with the output of the last inverter looped back to connect to the input of the first inverter. Because there are an odd number of inverters in the loop and because of the transition delay of each inverter, the outputs of the inverters oscillate. The signal transitions of the inverters' outputs experience jitter and the jitter is used as an entropy source to generate a random output bit. Because ring oscillators oscillate, they also consume considerable amounts of power.

Another type of TRNG circuit is a bistable cell. A bistable cell includes a pair of inverters connected in a loop. Through operation of additional circuit components, a bistable cell can be forced into a metastable state in which the output of each inverter is at an intermediate voltage value between a logic low level and a logic high level, and thus is neither a valid 0 nor a valid 1. When the metastable state is released, the cell collapses to a stable state at valid logic levels in which the output of one inverter is a 1 and the output of the other inverter is a 0, or vice versa. Bistable cells randomly collapse to a [1,0] state or a [0,1] state due to, for example, thermal noise internal to the cell. Bistable cells generally do not oscillate and thus, all else being equal, do not consume as much power as ring oscillators and other types of oscillatory-based TRNG circuits. However, if the two inverters of the bistable cell are not closely matched in terms of their output strengths, the cell will tend to be biased toward one of the two possible output states [1,0] or [0,1], and thus produce less entropy.

The embodiments described herein are directed to a configurable bistable cell. The bistable cell described herein includes a pair of inverters connected in a loop. That is, the output terminal of each inverter is connected to the input terminal of the other inverter. The disclosed bistable cell also includes one or more pairs of tristate buffers coupled in parallel between the output terminals of the inverters. In some embodiments, each tristate buffer pair includes two tristate buffers connected in opposite directions between the nodes that interconnect the inverters. As such, each inverter is connected to each pair of tristate buffers such that the output terminal of each inverter connects to the input terminal of one of the tristate buffers of a given pair of buffers and to the output terminal of the other tristate buffer of the pair.

Each tristate buffer is controllable through a control signal. The control signal can cause the respective buffer to operate in an active (drive) mode in which a signal on its input terminal is provided through to its output terminal, and in a tristate mode (also referred to as a high impedance mode) in which the buffer is configured to impose a high impedance between its input and output terminals. In some embodiments, the control signal causes both tristate buffers within a given pair of tristate buffers to operate concurrently in the active mode when the control signal is in a first logic state. When in a second logic state, the tristate buffers are configured to operate in the tristate mode. Each pair of tristate buffers is individually controllable by a separate control signal. As such, any one or more of the pairs of tristate buffers may be independently used to create an entropy harvesting state for the bistable cell for generation of a random bit. The entropy harvesting state may include a metastable state in some configurations of the bistable cell or other states in which entropy is sufficiently high to be used to generate a random bit. By controlling the number of tristate buffer pairs used to create an entropy harvesting state, the difference between the drive strength of the inverters and the collective drive strength of the tristate buffer pairs controlled to operate in their active state can be configured to thereby control the operation of the bistable cell. The drive strength of a device refers to the output current available during the transition or switching of an output. Dynamic drive strength provides the switching strength necessary to overcome a loaded environment when changing the state of the output. The driving device must effectively transition from sinking to sourcing current or vice-versa. The dynamic drive strength of a device defines the switching speeds of a device in various applications.

If the collective strength of the inverters is much larger than the collective strength of the selected tristate buffer pairs, the signal level on the output of the cell during the entropy harvesting state will be relatively constant and thus have little ripple and consume relatively little power. If, however, the number of tristate buffer pairs selected to be in their active state during the entropy harvesting he state is such that the collective strength of the inverters is approximately the same as the collective strength of the selected tristate buffer pairs, the signal level on the output of the cell during the entropy harvesting state will be oscillatory in nature and thus consume more power than when the inverter strength is much greater than the tristate buffers. However, the entropy harvesting state with an oscillatory output signal has higher entropy and thus will result in output bits that have greater randomness than when the inverter strength is much greater than the collective tristate buffer strength. The bistable cell described herein thus can be configured to prioritize power consumption albeit with less entropy, or to prioritize entropy and thus the randomness of the output bits albeit at higher power consumption levels. Further, the disclosed bistable cell can be produced using standard inverters and tristate buffers in existing component libraries, and thus customized inverters and/or tristate buffers need not be designed.

FIG. 1 shows an example of a true random number generator circuit in accordance with various embodiments. The TRNG circuit is, or includes, a configurable bistable cell in accordance with various embodiments. As shown, the bistable cell includes a pair of inverters 110 and 120. The output 112 of inverter 110 is connected to the input 122 of inverter 120, and the output 124 of inverter 120 is connected to the input 114 of inverter 110. As such, the common connection point between the output 112 of inverter 110 and the input 122 of inverter 120 defines a node 125, and the common connection point between the output 124 of inverter 120 and the input 114 of inverter 110 defines a node 130.

The bistable cell of FIG. 1 also includes multiple pairs of tristate buffers. The example of FIG. 1 shows a first pair 140*a* and a second pair 140*b* (referred to as pairs 140), but in general one or more pairs of tristate buffers are possible. In the example shown, each pair 140*a*, 140*b* of tristate buffers includes two tristate buffers connected in opposing directions between nodes 125 and 130. Tristate buffer pair 140*a* includes tristate buffers 142*a* and 144*a*, and tristate buffer pair 140*b* includes tristate buffers 142*b* and 144*b*. Each tristate buffer of each pair of tristate buffers includes an input terminal and output terminal. The output terminal of each of the inverters is connected to the input terminal of one of the tristate buffers of each such pair of tristate buffers as well as to the output terminal of the other tristate buffer of each such pair of tristate buffers.

Each pair 140*a*, 140*b* of tristate buffers is controlled by a control signal, labeled as CTLA (for tristate buffer pair 140*a*) and CTLB (for tristate buffer pair 140*b*) in FIG. 1. Assertion of CTLA to one logic state forces tristate buffers 142*a* and 144*a* to operate in their active states in which an input signal on their inputs from a corresponding node 125, 130 is driven through to their output and thus to the other node 125, 130. When controlled to the opposing logic state, the CTLA signal causes the tristate buffers to operate in their tristate mode, which causes a high impedance to be generated through both buffers between nodes 125 and 130. A logic high for CTLA may cause the tristate buffers to operate in their active state, while a logic low may force the operation of the tristate mode. Alternatively, a logic low may force the operation of the active state, while a logic high may force the operation of the tristate mode. The CTLB signal for buffer pair 140*b* functions similarly.

The configurable bistable cell described herein thus includes a plurality of control lines, with one control line provided to each pair of tristate buffers 140*a*, 140*b*. Each pair of tristate buffers is configured to be controlled, independent of any other pair of tristate buffers, by a control signal on its respective control line to operate in an active state or a high impedance state. During operation, a single pair of tristate buffers (e.g., buffer pair 140*a*) may be controlled via a control signal (e.g., CTLA) to operate in an active state to cause the entropy harvesting state to occur for the bistable cell. The other tristate buffer pairs may be tristated through use of their respective control signals (e.g., CTLB). The entropy harvesting state may be released by deassertion of CTLA to cause the bistable cell to collapse to a stable valid logic output state. The configurable bistable cell of FIG. 1 has two possible output nodes designated as OUT1 and OUT2 on the corresponding nodes 130, 125. In one stable valid logic output state, OUT1 and OUT2 are [1:0] meaning OUT1 is a 1 and OUT2 is a 0. The other possible valid logic output state is [0:1]. When the entropy harvesting state is released, the bistable cell collapses either to [0:1] or [1:0]. The logic state to which the cell collapses is independent of the previous collapsed state and occurs generally randomly based, at least in part, on the thermal noise inherent in the cell. The output voltages from the bistable cell are designated as V0 and V1 as shown.

Figure 3:
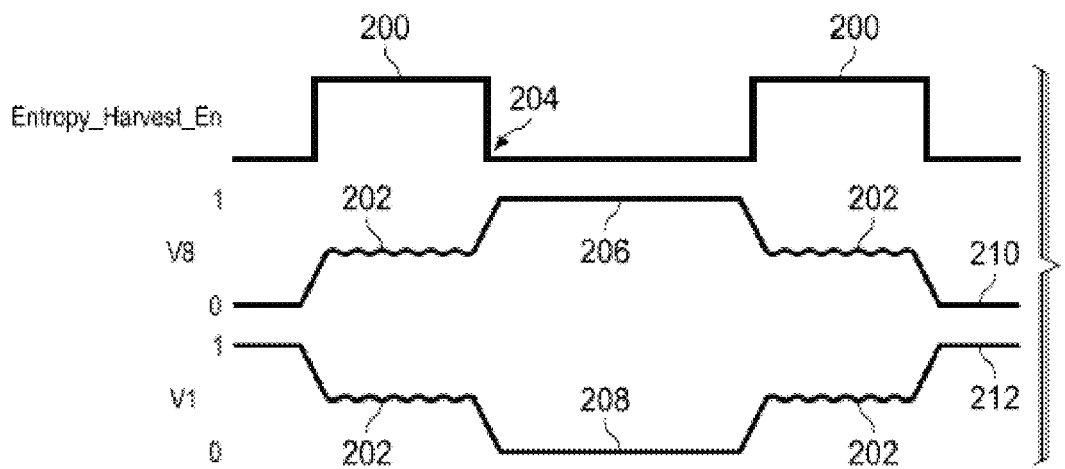
FIG. 3 illustrates waveforms in accordance with an example operation of the bistable cell configured to implement a generate a random bit in which specific tristate buffers within the cell are selected to harvest entropy using metastability such that the collective strength of the buffers are much less than the inverters.
Figure 4:
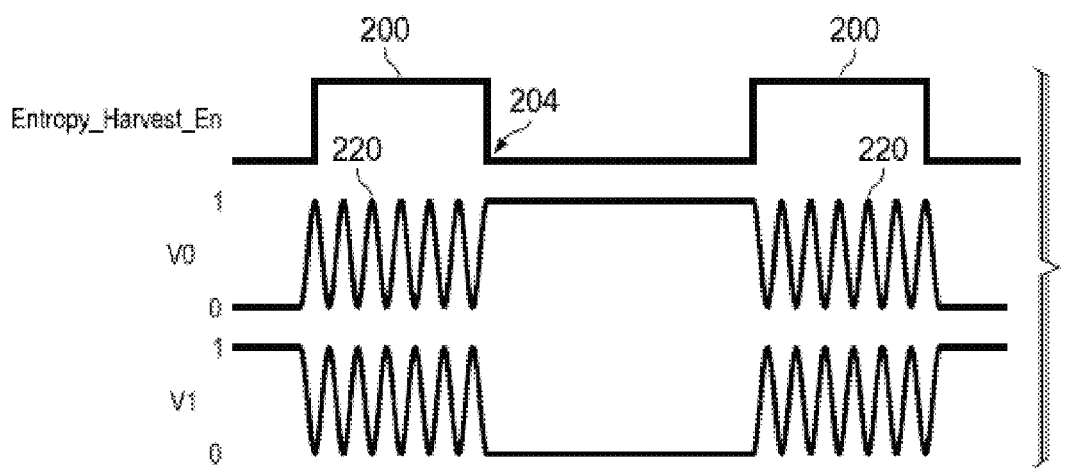
FIG. 4 illustrates waveforms in accordance with another example operation of the bistable cell configured to generate a random bit in which specific tristate buffers within the cell are selected to harvest entropy using random phase shifts in fast oscillations such that the collective strength of the buffers are approximately the same as that of the inverters.
Figure 5:
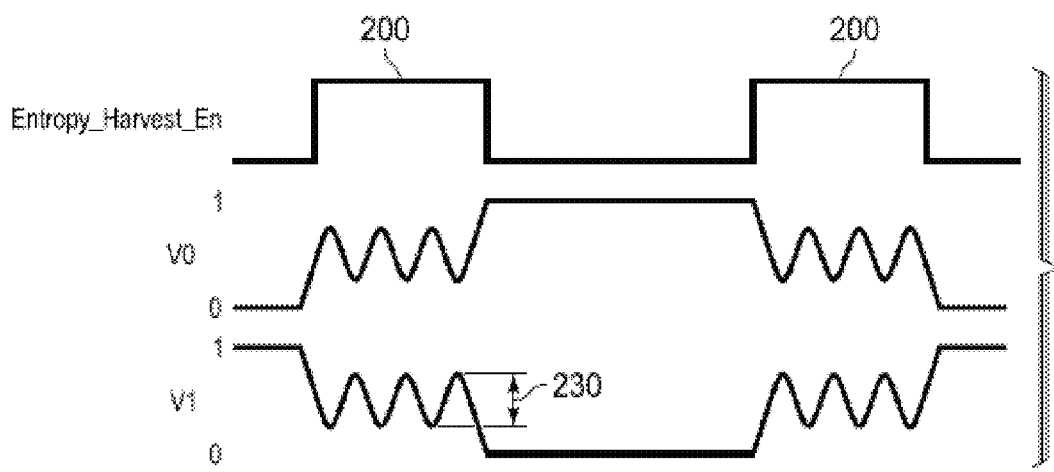
FIG. 5 illustrates waveforms in accordance with yet another example operation of the bistable cell configured to generate a random bit in which specific tristate buffers within the cell are selected to harvest entropy using both random phase-shift and metastability due to intermediate voltages such that the collective strength of the buffers are slightly greater than that of the inverters.

The drive strength of each inverter 110, 120 is greater than the drive strength of any of the tristate buffers 142, 144. Thus, when only one pair of tristate buffers is selected to force the entropy harvesting state to occur, the inverters' drive strength is significantly greater than the drive strength of the one tristate buffer pair. As additional pairs of tristate buffers are included to force the entropy harvesting state of the cell, the difference in drive strength between the inverters 110, 120 and the tristate buffers decreases and may be approximately the same. FIGS. 3-5 illustrate waveforms of the bistable cell with varying degrees of configurable tristate buffer drive strength.

Figure 2:
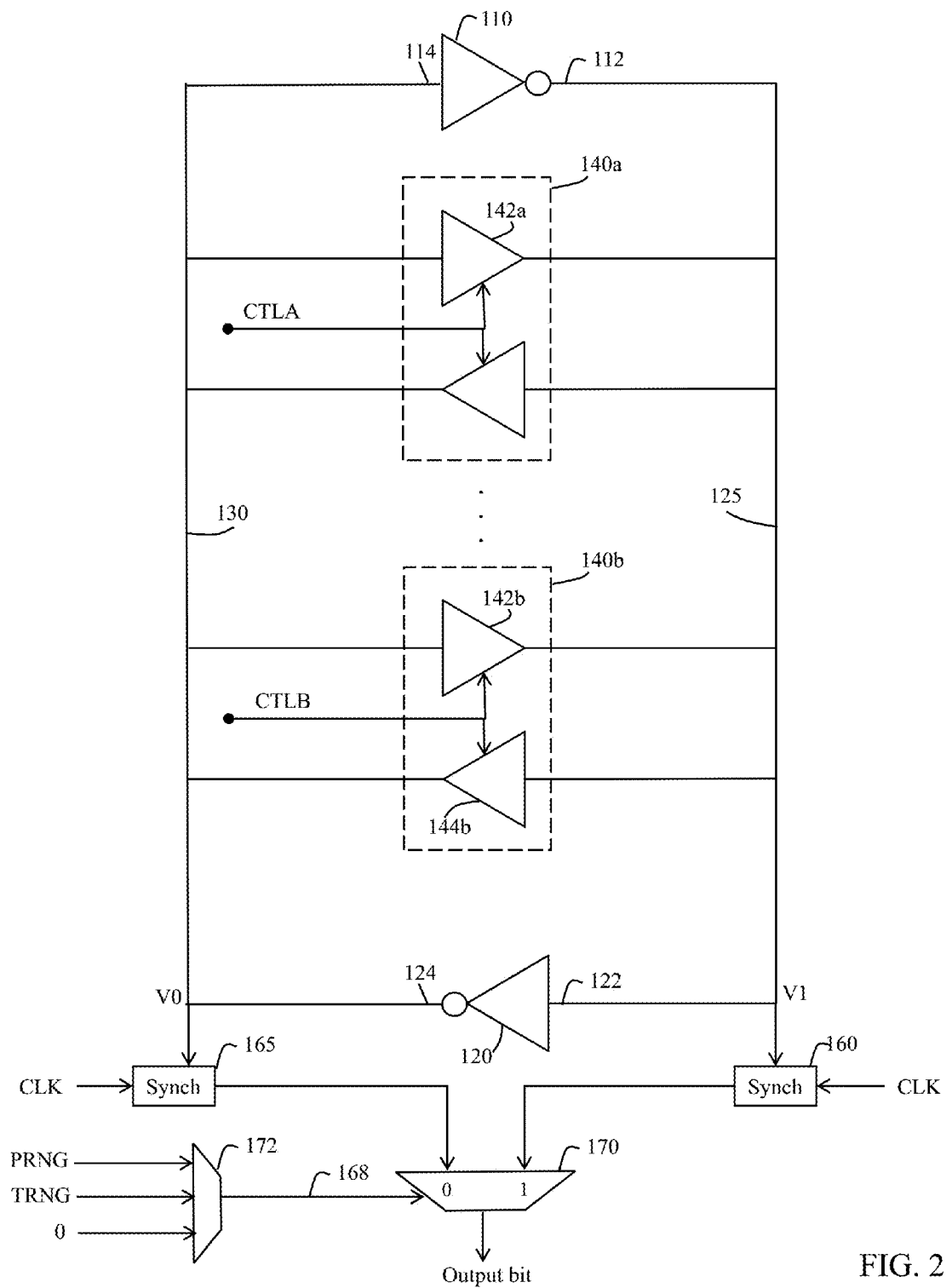
FIG. 2 shows another embodiment of a configurable bistable cell that includes selection logic controlled by other random number generators in accordance with various examples.

FIG. 2 shows another embodiment of the bistable cell. The nodes 125 and 130 are coupled to synchronizers 150 and 165, respectively. In some embodiments, each synchronizer 160, 165 comprises a pair of serially connected flip-flops clocked by a clock signal (CLK) as shown. The synchronizers synchronize the output signals from nodes 125 and 130 to a clock domain of logic configured to use the output bit from the bistable cell (e.g., a post-processing engine such as an encryption engine). A multiplexer 170 is included to select one of the output bits from either node 125 or 130 based on a control signal 168 from another multiplexer 172. Multiplexer 170 in the example of FIG. 2 has two inputs designated as "0" and "1". The synchronized output bit from node 130 is provided to the 0 input of multiplexer 170, and the synchronized output bit from node 125 is provided to the 1 input.

The input signals to multiplexer 172 can include a random output bit from a pseudo-random number generator or a true random number generator, or a fixed control signal (e.g., a logic 0 or a logic 1). Multiplexer 172 may be controlled by another control signal (not specifically shown) to select any of the input bits. The selected input bit to multiplexer 172 is used as the control signal 168 for multiplexer 170. The control signal 168 has a logic value of either a 0 or a 1 to select the corresponding 0 or 1 input of multiplexer 170. The use of the selection logic to select one of the two possible output bits from the bistable cell can add an additional degree of randomness.

As explained above, the drive strength of the inverters 110, 120 relative to the tristate buffers used to force the entropy harvesting state is configurable for the disclosed bistable cell. The fewer tristate buffer pairs 140 that are selected to force the entropy harvesting state, the stronger will be the strength of the inverters 110, 120 relative to the selected tristate buffers. Similarly, the more tristate buffer pairs 140 that are selected to force the entropy harvesting state, the closer will be the strength of the inverters 110, 120 relative to the selected tristate buffers. Moreover, the resulting entropy harvesting state behavior can be varied based on the inverter-to-buffer strength ratio in terms of greater randomness of the output bits or decreased power consumption.

FIG. 3 illustrates an operation of the bistable cell described herein with a number of tristate buffer pairs selected to force the entropy harvesting state, which in FIG. 3 is a metastable state, that results in the collective strength of the inverters being significantly greater than the collective strength of the selected tristate buffer pairs. For example, only a single pair of tristate buffers may be selected to force metastability. The waveform designated as Entropy Harvest En represents the control signals to the tristate buffer pairs that are selected to operate in the active state to force the metastable state for the bistable cell. That is, if both tristate buffer pairs 140a and 140b are selected for forcing metastability, then Entropy Harvest En represents both CTLA and CTLB becoming a high signal at 200 to cause tristate buffers 142a, 144a, 142b, and 144b to be in the active state.

The output voltages from the bistable cell are also shown in FIG. 3 as V0 and V1. During the metastable state, the output voltages are generally at an intermediate voltage as indicated at 202. When the metastable state is released at 204, the bistable cell collapses to the [1:0] state or the [0:1] state as explained above. In the example of FIG. 3, V0 becomes a logic high as shown at 206 and V1 becomes a logic 0 as shown at 208. Continuing the example of FIG. 3, the metastable state is again forced and when released, V0 becomes a logic low at 210 and V1 becomes a logic high at 212. The logic levels for V0 and V1 after each metastable stable release is independent of their former states and is generally random based on the thermal noise internal to the bistable cell.

Because the collective drive strength of the selected tristate buffers in the example of FIG. 3 is much less than that of the inverters, the voltage level of V0 and V1 is generally constant at an intermediate voltage. The bistable cell consumes relatively little power during the metastable state.

FIG. 4 shows another example of the operation of the bistable cell when enough tristate buffer pairs are selected to force the entropy harvesting state such that the collective strength of the selected tristate buffer pairs is approximately the same as the strength of the inverters. When this happens, the metastable state is characterized by oscillatory signals for V0 and V1 as shown. The reason for the oscillation may be that the inverters and selected tristate buffers function as a ring oscillator during the entropy harvesting state. When the entropy harvesting state is released, the cell collapses to one logic state or the other as described above.

Due to the oscillatory nature of the output voltages from the cell during the entropy harvesting state, the bistable cell configured for the tristate buffer strength to approximate the inverter strength will consume more power than for the configuration of FIG. 3 (buffer strength much less than inverter strength). However, a bistable cell configured per FIG. 4 will achieve a higher degree of randomness for its output bits than a bistable cell configured per FIG. 3.

FIG. 5 shows yet another operation of the bistable cell configured for the tristate buffers selected to force the entropy harvesting state to have a strength that is slightly less than the drive strength of the inverters. As for the example of FIG. 4, in FIG. 5 the output voltages V0 and V1 from the cell oscillate, but because the difference in strength between inverters and buffers in FIG. 5 is greater than the difference in strength between inverters and buffers for FIG. 4, the frequency of oscillation is smaller than was the case for the configuration of FIG. 4. Further, peak-to-peak voltage 230 in FIG. 5 for the oscillations is smaller than that of FIG. 4. As a result, a bistable cell configured to operate as shown in FIG. 5 may achieve the same degree of randomness as a cell configured per FIG. 4, but consume less power than for a cell configured per FIG. 4 due to the lower frequency oscillations.

In some embodiments, the length of time that the tristate buffers are operated in their active state to force the entropy harvesting state is configurable. It may take a period of time for enough entropy to accumulate in the bistable cell to achieve sufficient entropy for generation of a suitably random bit. Thus, the disclosed bistable cell is configurable in terms of the length of time that the selected tristate buffers are operated in their active state before the entropy harvesting state is released and the cell is permitted to collapse to one valid logic state or another. Further, the length of time may be configurable depending, for example, on the application for use of the bistable cell. For example, one application may be to use the bistable cell to occasionally generate an encryption key. The amount of randomness may be important and thus the length of time to achieve and ensure sufficient entropy may be configured to a longer time period to ensure a sufficient amount of entropy in the circuit. Another application may be to use bistable cell to produce a random number for a calculation. In this latter application, the amount of randomness may not be as important as for the former key generation application, and computational speed may be important. Thus, in this latter application, the period of time for the metastable state may be configured to a shorter time value.

Figure 6:
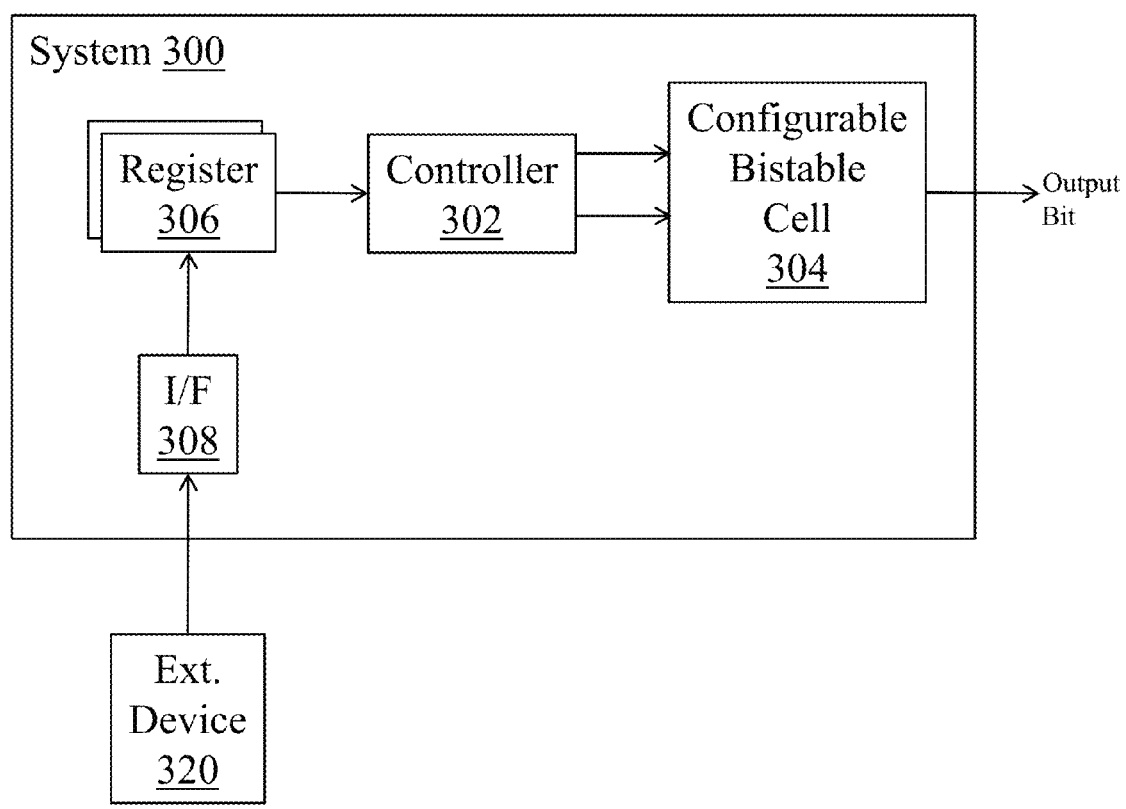
FIG. 6 shows an example of a system including a configurable bistable cell that can be configured via an external device in accordance with various embodiments.

FIG. 6 shows a block diagram of a system that includes a configurable bistable cell as described above. In this diagram, a system 300 is shown to include a controller 302, a configurable bistable cell 304, one or more registers 306 (comprising a storage medium), and an interface 308. An external device 320, such as a computer, may be coupled to the interface 308 of the system 300. The interface 308 may be wired or a wireless interface.

The external device 320 can download configuration settings through interface 308 to be stored in registers 306, or other types of storage elements. The configuration settings may include a first value indicative of the number of tristate buffer pairs within the configurable bistable cell 304 that are to be used to force the entropy harvesting state. The first value may be an integer number (1 or greater) that corresponds to the number of tristate buffers desired for creating metastability. By way of another example, the first value may be a setting corresponding to the type of metastability behavior that is desired. For example, FIGS. 3-5 illustrate three different behaviors and the first value may be a code that maps to each of those behaviors. One code may correspond to a configuration in which the selected tristate buffer(s) have much lower collective strength than the inverters. Another code may correspond to a configuration in which the selected tristate buffer(s) have approximately the same collective strength as the inverters, while yet another code may correspond to a configuration in which the selected tristate buffer(s) slightly lower collective strength as the inverters. The codes may be an alphanumeric code, a binary code, or any other type of value.

The configuration settings stored in the registers 306 from the external device 320 may include a second value that indicates the period of time to implement for each entropy harvesting state. The second value may be specified as a period of time (e.g., in units of microseconds, milliseconds, etc.) or may be specified as a value to indicate a relative period of time such as short, medium, and long. The first and second values may be stored in the same register or in different registers of a storage element.

During operation, the controller 302 accesses the registers 306 and configures the operation of the bistable cell 304 according to the first and second values described above. The signals from the controller 302 to the configurable bistable cell 304 include the control signals (e.g., CTLA, CTLB) for the tristate buffer pairs as well as the control signals to control the multiplexers 170 and 172. The control signals to control the tristate buffers select the number of tristate buffers in accordance with the first value and maintain the selected tristate buffers in their active states to force metastability for a period of time as specified by the second value. In some embodiments, a user does not have control over which specific tristate buffer pairs are used to implement the entropy harvesting state, rather only the number of buffer pairs that are used. The controller 302 may be preconfigured to select specific buffer pairs based on the first value specified by a user via the external device 320.

Figure 7:
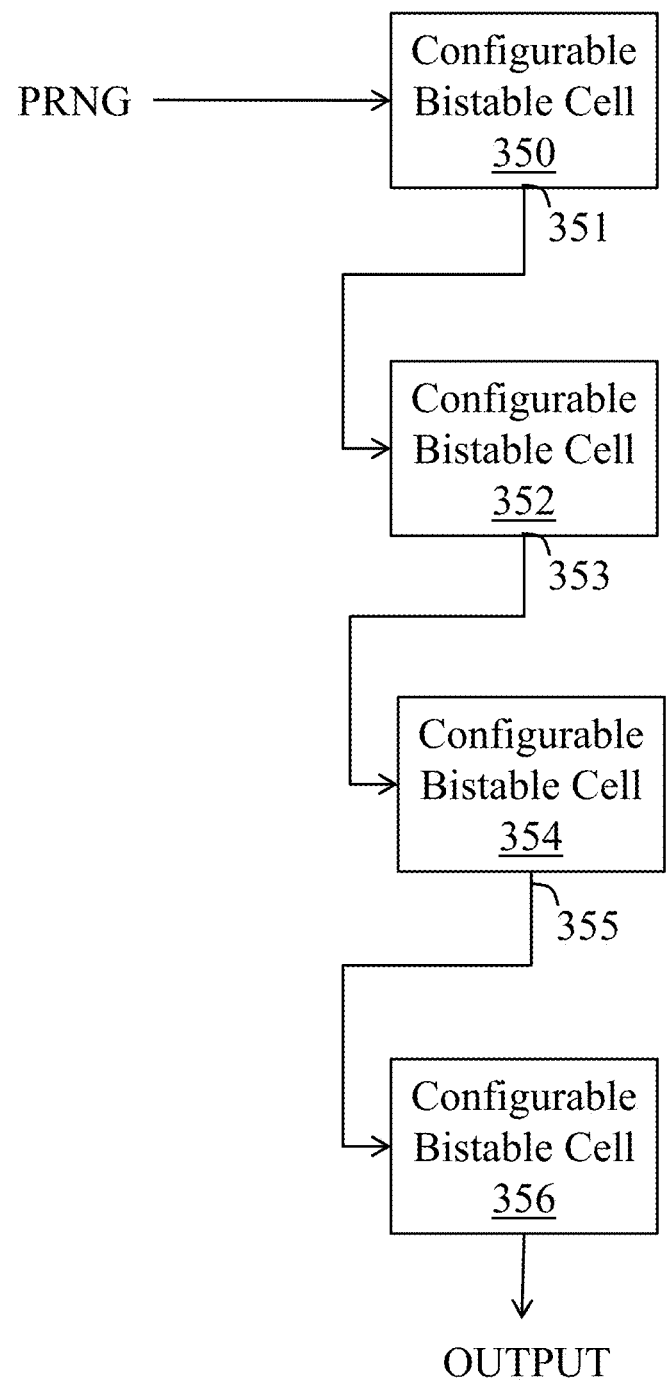
FIG. 7 shows an example of multiple configurable bistable cells connected in a daisy chain in accordance with various embodiments.

FIG. 7 shows an example including a plurality of bistable cells connected in a daisy chain. The example shows four configurable bistable cells 350, 352, 354, and 356. A bit from a PRNG is provided to the first configurable bistable cell 350 in the chain to select, via a multiplexer such as multiplexer 170, one of the output bits from the cell. The selected output bit 351 from configurable bistable cell 350 is provided as the selection bit for the next configurable bistable cell 352 in the chain, that is, the bit to select the output bit produced by cell 352 (via its multiplexer 170) after its metastability is released. Similarly, the selected output bit 355 from cell 352 is used as a selection bit to configurable bistable cell 356 and is used to select one of its two possible output bits as the random output bit from the chain of bistable cells. By daisy chaining together multiple configurable bistable cells, the resulting output bits may have a higher degree of randomness than if only a single configurable bistable cell was used.

Figure 8:
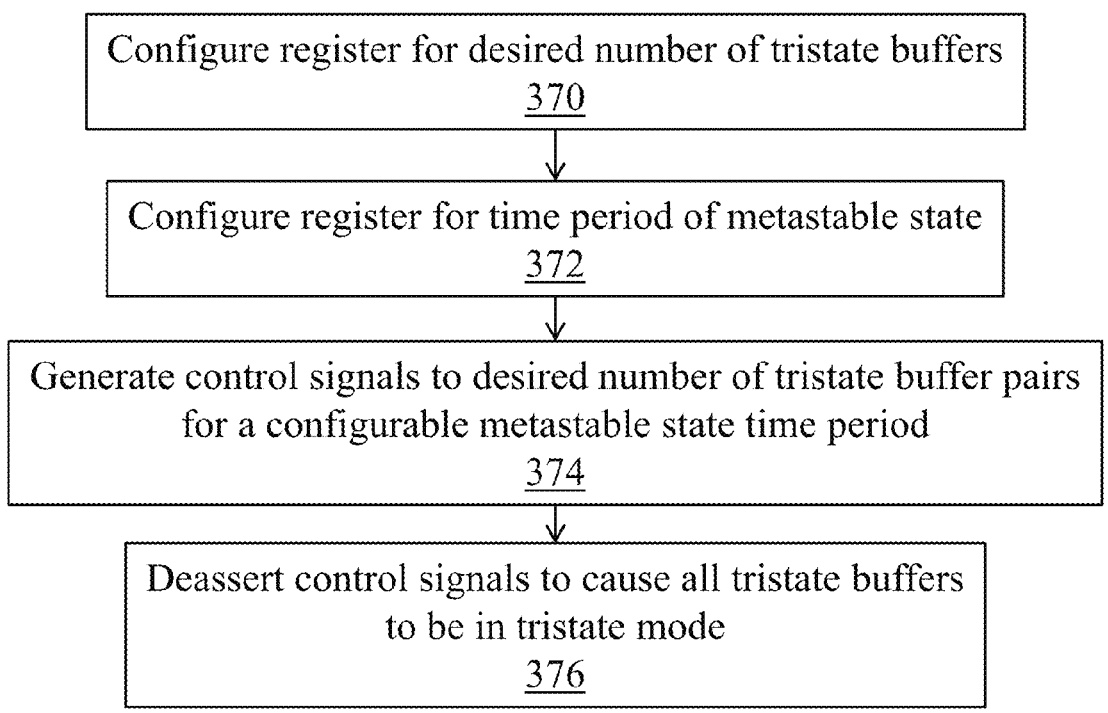
FIG. 8 shows a method in accordance with various embodiments.

FIG. 8 shows a method in accordance with various embodiments. The operations may be performed in the order shown, or in a different order. Further, two or more of the operations may be performed concurrently instead of sequentially. At 370, the method includes configuring a register for a particular number of tristate buffer pairs to be active for forcing the occurrence of the entropy harvesting state. As explained above, a first value may be downloaded to a register within a system that includes a configurable bistable cell such as that described with respect to FIG. 6. The value may specify the desired integer number of pairs of tristate buffers or a value by which the controller 302 may map to a specific number of pairs of tristate buffers.

At 372, the method includes configuring a register (the same or different register as the register referenced in operation 370) for a time period to implement for the entropy harvesting state of the bistable cell. As explained above, a second value may be downloaded to the register within the system, and the second value may specify the desired time period (e.g., number of microseconds, number of milliseconds, etc.). Alternatively, the second value may specify a value that maps to a particular time period. For example, a value of 1 may map to a time period of 1 millisecond, while a value of 2 may map to a time period of 10 milliseconds. The controller 302 may be preconfigured with such mappings.

At 374 when a random output bit is needed from the configurable bistable cell, the controller 302 generates control signals for one or more of the pairs of tristate buffers 140 in accordance with the first and second values stored in the registers per operations 370 and 372. That is, the controller asserts control signals to a particular number of tristate buffer pairs 140 to cause the corresponding tristate buffers to operate in their active state and attempt to drive the voltage level from node 125 on to node 130, and vice versa, as described above. The particular number of tristate buffer pairs selected during this mode of operation corresponds to the first value noted above, and the length of time the entropy harvesting state is enforced by the selected tristate buffer pairs corresponds to the second value.

The controller 302 may implement a timer function (software or hardware) that initializes at the beginning of the entropy harvesting state and expires at the end of the time period corresponding to the second value. When the timer expires, at 376 the controller 302 deasserts the control signals to the tristate buffer pairs, thereby causing all tristate buffers to be in their tristate mode. The non-selected tristate buffer pairs are already in the tristate mode, and the tristate buffer pairs selected to implement metastability are caused to be transitioned to the tristate mode. With all of the tristate buffers in a tristate mode, the bistable cell is permitted to collapse to a valid logic state [1:0] or [0:1] as explained above to thereby generate a random output bit. Operations 374 and 376 can be repeated over and over, under control by the controller 302, to generate additional random output bits as needed.

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to. . . . " Also, the term "couple" or "couples" is intended to mean either an indirect or direct wired or wireless connection. Thus, if a first device couples to a second device, that connection may be through a direct connection or through an indirect connection via other devices and connections.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A random number generator circuit, comprising:
   first and second inverters, each inverter including an input terminal and an output terminal, wherein the output terminal of each inverter is connected to the input terminal of the other inverter;
   a plurality of pairs of tristate buffers coupled in parallel between the output terminals of the inverters, each pair having a respective control line and each pair including a first tristate buffer and a second tristate buffer; and
   wherein each tristate buffer of each pair of tristate buffers includes an input terminal and an output terminal, and wherein, for each pair of tristate buffers, the output terminal of the first inverter is connected to the input terminal of the first tristate buffer and the output terminal of the second inverter is connected to the input terminal of the second tristate buffer, and the output terminal of the first inverter also is connected to the output terminal of the second tristate buffer and the output terminal of the second inverter is connected to the output terminal of the first tristate buffers;
   wherein each pair of tristate buffers is configured to be controlled, independent of any other pair of tristate buffers, by a control signal on its respective control line to operate in an active state or a high impedance state.

2. The random number generator circuit of claim 1, further comprising storage for a first value, wherein the first value is indicative of which of the pairs of tristate buffers are to be controlled to operate in the active state to force implementation of an entropy harvesting state.

3. The random number generator circuit of claim 2, wherein the storage is configured to store a second value indicative of the length of time for those pairs of tristate buffers to be controlled to operate in the active state during the entropy harvesting state.

4. The random number generator circuit of claim 1, further comprising:
   a first synchronizer coupled to the output terminal of one of the inverters and including a first synchronizer output terminal;
   a second synchronizer coupled to the output terminal of the other of the inverters and including a second synchronizer output terminal; and
   a selection circuit coupled to the first and second synchronizers and configured to select a signal on one of the first or second synchronizer output terminals based on a selection control signal.

5. The random number generator circuit of claim 4,
   wherein the selection circuit includes a first multiplexer configured to receive the output signals from the first and second synchronizer output terminals as inputs to the first multiplexer;
   wherein the first multiplexer is controllable to select one of its inputs based on a control signal from a second multiplexer; and
   wherein the second multiplexer includes a plurality of inputs, one of which is an output from another random number generator.

6. A random number generator system, comprising:
   a bistable cell comprising:
      a pair of inverters, each inverter including an input terminal and an output terminal, wherein the output terminal of each inverter is connected to the input terminal of the other inverter;
      a pair of tristate buffers coupled in parallel between the output terminals of the inverters, wherein each of the tristate buffers is configured to drive signals in opposite directions between the inverters' output terminals; and
      a controller coupled to the pair of tristate buffers, wherein the controller is configured to cause the tristate buffers to selectively operate in:
         an active state to thereby cause signals on the output terminals of the inverters to be in an entropy harvesting state; and
         a high impedance state to thereby cause signals on the output terminals of the inverters to transition to a logic low or a logic high.

7. The random number generator system of claim 6, wherein the controller is coupled to the pair of tristate buffers via a control line, and wherein the controller is configured to:
   generate a first signal on the control line to cause the tristate buffers to operate in the active state; and
   generate a second signal on the control to cause the tristate buffers to operate in the high impedance.

8. The random number generator system of claim 6, further comprising a another pair of tristate buffers coupled in parallel between the output terminals of the inverters, each pair of tristate buffers coupled to a separate control line, and wherein each pair of tristate buffers is configured to be controlled independent of any other pair of tristate buffers, by a control signal on its respective control line to operate in an active state or a high impedance state.

9. The random number generator system of claim 8, further comprising storage for a first value is storable, wherein the first value is indicative of which of the pairs of tristate buffers are to be controlled to operate in the active state to force implementation of an entropy harvesting state.

10. The random number generator system of claim 8, wherein the storage is configured to store a second value indicative of the length of time for those pairs of tristate buffers to be controlled to operate in the active state.

11. The random number generator circuit of claim 6, further comprising:
   a first synchronizer coupled to the output terminal of one of the inverters and including a first synchronizer output terminal;
   a second synchronizer coupled to the output terminal of the other inverter of the inverters and including a second synchronizer output terminal; and
   a selection circuit coupled to the first and second synchronizers and configured to select a signal on one of the first or second synchronizer output terminals based on a selection control signal.

12. The random number generator system of claim 11,
   wherein the selection circuit includes a first multiplexer configured to receive the output signals from the first and second synchronizer output terminals as inputs to the first multiplexer;
   wherein the first multiplexer is controllable to select one of its inputs based on a control signal from a second multiplexer; and
   wherein the second multiplexer includes a plurality of inputs one of which is an output from another random number generator.

13. The random number generator system of claim 6, further comprising another bistable cell, and wherein:
   each bistable cell includes a pair of tristate buffers, a pair of inverters, and selection logic to produce an output bit for the pair of inverters;

within the pair of inverters of each bistable cell, each inverter includes an input terminal and an output terminal and the output terminal of each inverter is connected to the input terminal of the other inverter;

within each bistable cell, the tristate buffers are coupled in parallel between the output terminals of the inverters, and the tristate buffers are configured to drive signals in opposite directions between the inverters' output terminals; and the plurality of bistable cells are coupled in a daisy chain with the selection logic of one bistable cell coupled to a control input of the selection logic of the next bistable cell in the daisy chain.

14. The random number generator system of claim 6, wherein the bistable cell includes a plurality of pairs of tristate buffers, and the random number generator system further comprises an interface and storage, wherein the storage is configured to store programming data received via the interface;

wherein the programming data includes a first value indicative of which of the pairs of tristate buffers are to be controlled to operate in the active state to force implementation of the entropy harvesting state, and wherein the programming data includes a second value indicative of the length of time for those pairs of tristate buffers to be controlled to operate in the entropy harvesting state.

15. A method, comprising:

writing to storage a first value indicative of a number of pairs of tristate buffers coupled to a pair of inverters, the buffers and the inverters forming a bistable cell;

writing to the storage a second value indicative of a time period of an entropy harvesting state;

asserting control signals to the number of pairs of tristate buffers to force occurrence entropy harvesting state for the bistable cell for the time period; and deasserting the control signals to cause the tristate buffers to be in a tristate mode to produce a random output bit from the bistable cell.

16. The method of claim 15, further comprising asserting a selection signal to a multiplexer configured to receive an output signal from each of the inverters.

17. The method of claim 15, further comprising synchronizing an output signal from each inverter to a clock signal.

18. The method of claim 15, wherein writing the first and second values comprises receiving the first and second values from a device external to the bistable cell.

19. The method of claim 15, wherein the number of pairs of tristate buffers is less than a total number of pairs of tristate buffers in the bistable cell.

20. The method of claim 15, further comprising using the random output bit as a selection signal for selection logic of another bistable cell.

\* \* \* \* \*